(12) United States Patent
Lu

(10) Patent No.: US 10,903,151 B2
(45) Date of Patent: Jan. 26, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 115 days.

(21) Appl. No.: 15/987,622

(22) Filed: May 23, 2018

(65) Prior Publication Data
US 2019/0363040 A1 Nov. 28, 2019

(51) Int. Cl.
*H01L 23/498* (2006.01)
*H01L 21/48* (2006.01)
*H01L 23/00* (2006.01)

(52) U.S. Cl.
CPC .... *H01L 23/49811* (2013.01); *H01L 21/4853* (2013.01); *H01L 23/49838* (2013.01); *H01L 23/49866* (2013.01); *H01L 24/16* (2013.01); *H01L 2224/16227* (2013.01); *H01L 2924/01022* (2013.01); *H01L 2924/01028* (2013.01); *H01L 2924/01029* (2013.01); *H01L 2924/01046* (2013.01); *H01L 2924/01047* (2013.01); *H01L 2924/01074* (2013.01); *H01L 2924/01078* (2013.01); *H01L 2924/01079* (2013.01); *H01L 2924/15165* (2013.01); *H01L 2924/15321* (2013.01); *H01L 2924/15738* (2013.01); *H01L 2924/15763* (2013.01); *H01L 2924/18161* (2013.01); *H01L 2924/3511* (2013.01); *H01L 2924/35121* (2013.01); *H01L 2924/3841* (2013.01)

(58) Field of Classification Search
CPC ........... H01L 23/49811; H01L 21/4853; H01L 23/49838; H01L 23/49866; H01L 24/16
See application file for complete search history.

(56) References Cited

U.S. PATENT DOCUMENTS

| | | | | | |
|---|---|---|---|---|---|
| 3,821,785 | A | * | 6/1974 | Rose | H01L 21/00 257/751 |
| 5,912,510 | A | * | 6/1999 | Hwang | H01L 24/81 257/778 |
| 6,400,021 | B1 | * | 6/2002 | Cho | H01L 24/02 257/738 |
| 6,492,198 | B2 | * | 12/2002 | Hwang | H01L 24/11 438/108 |
| 7,064,436 | B2 | * | 6/2006 | Ishiguri | H01L 24/03 257/738 |
| 7,253,519 | B2 | * | 8/2007 | Huang | H01L 24/11 257/738 |

(Continued)

*Primary Examiner* — Earl N Taylor
(74) *Attorney, Agent, or Firm* — Foley & Lardner LLP

(57) ABSTRACT

A semiconductor substrate includes a dielectric layer, a first conductive layer, a first barrier layer and a conductive post. The dielectric layer has a first surface and a second surface opposite to the first surface. The first conductive layer is disposed adjacent to the first surface of the dielectric layer. The first barrier layer is disposed on the first conductive layer. The conductive post is disposed on the first barrier layer. A width of the conductive post is equal to or less than a width of the first barrier layer.

31 Claims, 16 Drawing Sheets

(56) References Cited

U.S. PATENT DOCUMENTS

| | | | | |
|---|---|---|---|---|
| 7,446,422 B1* | 11/2008 | Paek | H01L 23/3114 | 257/779 |
| 8,314,491 B2* | 11/2012 | Yamashita | H01L 24/11 | 257/737 |
| 8,441,124 B2* | 5/2013 | Wu | H01L 23/49811 | 257/737 |
| 8,569,162 B2* | 10/2013 | Chien | H01L 24/11 | 438/613 |
| 8,643,150 B1* | 2/2014 | Xu | H01L 24/11 | 257/632 |
| 8,659,155 B2* | 2/2014 | Cheng | H01L 24/13 | 257/738 |
| 9,013,042 B2* | 4/2015 | Lin | H01L 24/00 | 257/762 |
| 9,570,413 B2* | 2/2017 | Hu | H01L 24/13 | |
| 9,831,202 B2* | 11/2017 | Seo | H01L 24/13 | |
| 9,892,988 B2* | 2/2018 | Hu | H01L 23/3192 | |
| 9,984,989 B2* | 5/2018 | Chen | H01L 24/14 | |
| 10,249,589 B2* | 4/2019 | Yajima | H01L 24/06 | |
| 10,283,471 B1* | 5/2019 | Lu | H01L 24/3171 | |
| 2002/0020855 A1* | 2/2002 | Hwang | H01L 24/11 | 257/200 |
| 2003/0164552 A1* | 9/2003 | Tong | H01L 24/10 | 257/779 |
| 2004/0065949 A1* | 4/2004 | Chen | H01L 24/13 | 257/692 |
| 2007/0252275 A1* | 11/2007 | Huang | H01L 21/76838 | 257/737 |
| 2008/0194095 A1* | 8/2008 | Daubenspeck | H01L 23/3192 | 438/612 |
| 2009/0079094 A1* | 3/2009 | Lin | H01L 24/13 | 257/778 |
| 2010/0140797 A1* | 6/2010 | Yanase | H01L 24/05 | 257/737 |
| 2011/0101527 A1* | 5/2011 | Cheng | H01L 24/11 | 257/738 |
| 2011/0198748 A1* | 8/2011 | Koike | H01L 23/53238 | 257/737 |
| 2012/0007230 A1* | 1/2012 | Hwang | H01L 24/13 | 257/737 |
| 2012/0161330 A1* | 6/2012 | Hlad | H05K 1/113 | 257/774 |
| 2013/0009307 A1* | 1/2013 | Lu | H01L 24/03 | 257/738 |
| 2013/0249082 A1* | 9/2013 | Chien | H01L 21/563 | 257/737 |
| 2013/0252383 A1* | 9/2013 | Chen | H01L 21/6835 | 438/127 |
| 2014/0015124 A1* | 1/2014 | Fay | H01L 21/311 | 257/737 |
| 2014/0070409 A1* | 3/2014 | Lai | H01L 25/50 | 257/737 |
| 2014/0077359 A1* | 3/2014 | Tsai | H01L 25/50 | 257/737 |
| 2014/0211438 A1* | 7/2014 | Lin | H01L 24/11 | 361/767 |
| 2014/0264844 A1* | 9/2014 | Ying | H01L 23/3128 | 257/737 |
| 2015/0228596 A1* | 8/2015 | Hu | H01L 24/03 | 257/737 |
| 2015/0235940 A1* | 8/2015 | Chen | H01L 23/5226 | 257/759 |
| 2015/0333025 A1* | 11/2015 | Arvin | H01L 24/13 | 257/737 |
| 2016/0268184 A1* | 9/2016 | Hirano | C25D 5/022 | |
| 2016/0351519 A1* | 12/2016 | Sameshima | H01L 24/32 | |
| 2017/0018489 A1* | 1/2017 | Gandhi | H01L 23/49811 | |
| 2017/0084561 A1* | 3/2017 | Seo | H01L 24/05 | |
| 2017/0176831 A1* | 6/2017 | Dixit | B32B 17/10513 | |
| 2017/0179012 A1* | 6/2017 | Shimodaira | H01L 23/49838 | |
| 2017/0194240 A1* | 7/2017 | Park | H01L 21/4857 | |
| 2017/0200687 A1* | 7/2017 | Chen | H01L 24/11 | |
| 2017/0278814 A1* | 9/2017 | Hung | H01L 24/11 | |
| 2017/0373031 A1* | 12/2017 | Yajima | H01L 24/13 | |
| 2018/0138115 A1* | 5/2018 | Lu | H01L 21/6835 | |
| 2018/0301396 A1* | 10/2018 | Pan | H01L 23/5222 | |
| 2019/0096823 A1* | 3/2019 | Fang | H01L 21/4853 | |
| 2019/0109109 A1* | 4/2019 | Dadvand | H01L 24/11 | |
| 2019/0363040 A1* | 11/2019 | Lu | H01L 25/16 | |

* cited by examiner

SEMICONDUCTOR DEVICE PACKAGE AND METHOD OF MANUFACTURING THE SAME

BACKGROUND

1. Technical Field

The present disclosure relates generally to a semiconductor device package and a method of manufacturing the same, and to a semiconductor device package including a barrier structure and a method of manufacturing the same.

2. Description of the Related Art

A semiconductor device package may include solder balls that electrically connect an electronic component to a substrate. When forming soldering contacts on a substrate, a bleeding may occur (e.g. during a reflow process), which would cause an undesired short (e.g., bridge) between two conductive pads. To avoid the bridge issue, a solder resist should be used. However, the use of the solder resist would increase the manufacturing cost and the thickness of the semiconductor device package. In addition, due to the coefficient of thermal expansion (CTE) mismatch between the solder resist and the substrate, a warpage issue would occur, which may further cause a delamination at the interface between the solder resist and the substrate.

SUMMARY

In one or more embodiments, a semiconductor substrate includes a dielectric layer, a first conductive layer, a first barrier layer and a conductive post. The dielectric layer has a first surface and a second surface opposite to the first surface. The first conductive layer is disposed adjacent to the first surface of the dielectric layer. The first barrier layer is disposed on the first conductive layer. The conductive post is disposed on the first barrier layer. A width of the conductive post is equal to or less than a width of the first barrier layer.

In one or more embodiments, a semiconductor device package includes a substrate and an electronic component. The substrate has a first surface and a second surface opposite to the first surface. The substrate has a first conductive layer, a first barrier layer and a conductive post. The first conductive layer is disposed adjacent to the first surface of the substrate. The first barrier layer is disposed on the first conductive layer. The conductive post is disposed on the first barrier layer. A width of the conductive post is equal to or less than a width of the first barrier layer. The electronic component is disposed on the second surface of the substrate and electrically connected to the first conductive layer.

In one or more embodiments, a method for manufacturing a semiconductor device package includes (a) forming a barrier layer having a first surface and a second surface opposite to the first surface; (b) forming a first conductive layer on the first surface of the barrier layer; (c) forming a dielectric layer to cover the barrier layer and the first conductive layer and to expose the second surface of the barrier layer; and (d) forming a conductive post on the second surface of the barrier layer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
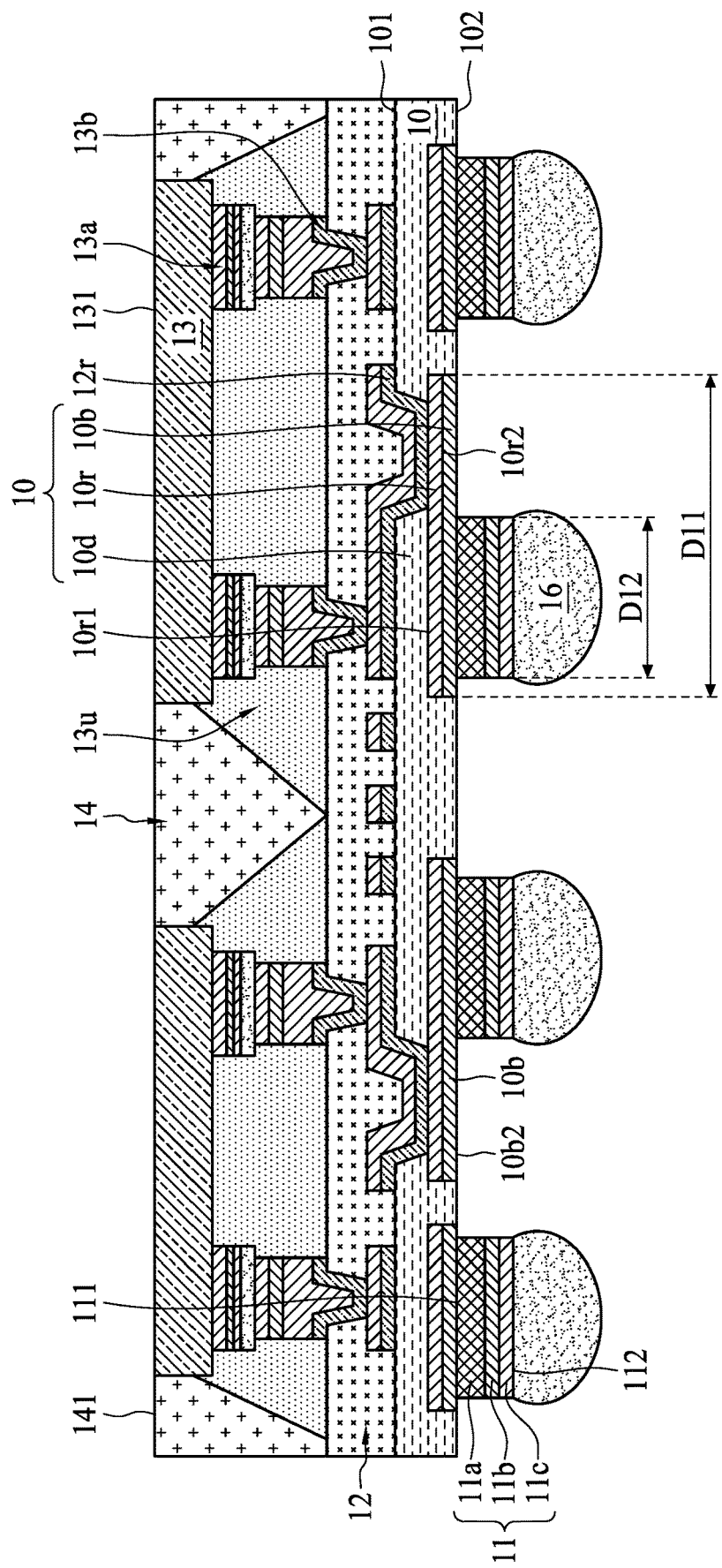
FIG. 1A illustrates a cross-sectional view of a semiconductor device package in accordance with some embodiments of the present disclosure.

FIG. 1A illustrates a cross-sectional view of a semiconductor device package 1 in accordance with some embodiments of the present disclosure. The semiconductor device package 1 includes a substrate 10, a conductive post 11, a passivation layer 12, an electronic component 13 and a package body 14.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the substrate 10 is a semiconductor substrate. In some embodiments, the surface 101 of the substrate 10 is referred to as a second surface and the surface 102 of the substrate is referred to as a first surface. In some embodiments, a thickness of the substrate 10 is from about 5 micrometer (μm) to about 20 μm.

Figure 1B:
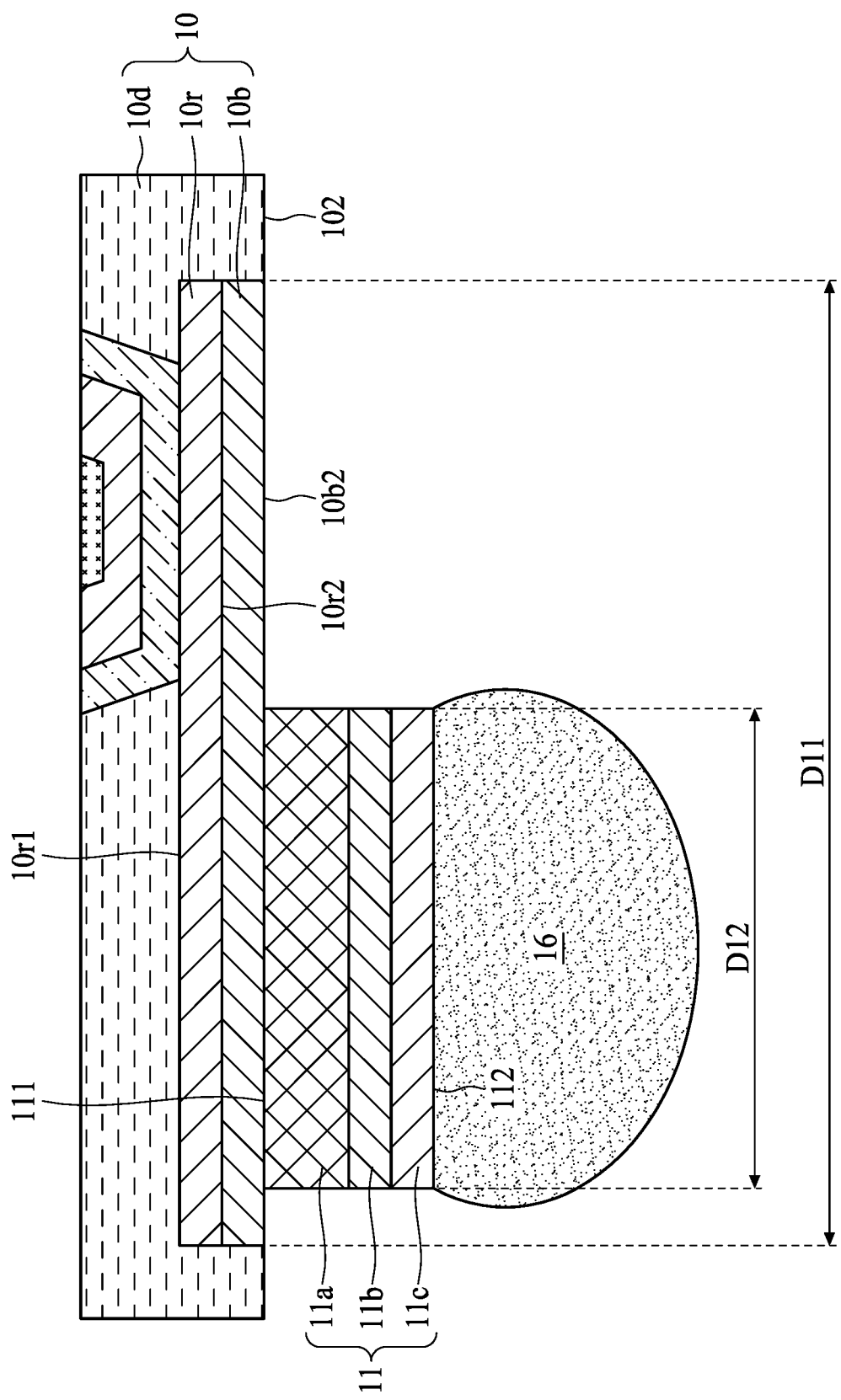
FIG. 1B illustrates an enlarged view of a portion of the semiconductor device package in FIG. 1A in accordance with some embodiments of the present disclosure.

In some embodiments, as shown in FIG. 1B, which illustrates an enlarged view of a portion of the substrate 10 and the conductive post 11, the substrate 10 includes a conductive layer 10r, a barrier layer 10b and a dielectric layer 10d. The conductive layer 10r is disposed adjacent to the surface 102 of the substrate 10 (or the surface 102 of the dielectric layer 10d) and within the dielectric layer 10d. The conductive layer 10r has a surface 10r1 facing away the conductive post 11 and a surface 10r2 opposite to the surface 10r1. In some embodiments, the conductive layer 10r functions as the RDL of the substrate 10 to provide electrical connections. In some embodiments, the conductive layer 10r is formed of or includes gold (Au), silver (Ag), copper (Cu), platinum (Pt), Palladium (Pd), other metal(s) or alloy(s), or a combination of two or more thereof. In some embodiments, a thickness of the conductive layer 10r is from about 1 μm to about 3 μm.

The barrier layer 10b is disposed on the surface 10r2 of the conductive layer 10r. In some embodiments, the barrier layer 10b is in contact with the surface 10r2 of the conductive layer 10r. In some embodiments, the barrier layer 10b is conformal to the first metal layer 14a. For example, as shown in FIG. 1B, the conductive layer 10r and the barrier layer 10b have a common width D11. In some embodiments, a surface 10b2 of the barrier layer 10b is substantially coplanar with the surface 102 of the substrate 10. In some embodiments, the barrier layer 10b includes titanium (Ti), nickel (Ni), tungsten (W), other metal(s) or alloy(s), or a combination of two or more thereof. In some embodiments, a thickness of the barrier layer 10b is from about 1 μm to about 5 μm.

The dielectric layer 10d covers a portion of the conductive layer 10r and a portion of the barrier layer 10b. In some embodiments, the dielectric layer 10d may include an organic material, a solder mask, a polyimide (PI), an epoxy, an Ajinomoto build-up film (ABF), one or more molding compounds, one or more pre-impregnated composite fibers (e.g., a pre-preg fiber), a borophosphosilicate glass (BPSG), a silicon oxide, a silicon nitride, a silicon oxynitride, an undoped silicate glass (USG), any combination thereof, or the like. Examples of molding compounds may include, but are not limited to, an epoxy resin including fillers dispersed therein. Examples of a pre-preg fiber may include, but are not limited to, a multi-layer structure formed by stacking or laminating one or more pre-impregnated materials or sheets. In some embodiments, the dielectric layer 10d may include an inorganic material, such as silicon, a ceramic or the like.

The conductive post 11 is disposed on the surface 102 of the substrate 10. In some embodiments, the conductive post 11 is disposed on the surface 10b2 of the barrier layer 10b. In some embodiments, the conductive post 11 is in contact with the barrier layer 10b. For example, the conductive post 11 has a surface 111 in contact with the surface 10b2 of the barrier layer 10b. In some embodiments, the surface 111 of the conductive post 11 is substantially coplanar with the surface 102 of the substrate 10. In some embodiments, a width D12 of the conductive post 11 is less than or equal to the width D11 of the barrier layer 10b and/or the conductive layer 10r. For example, a projection area of the conductive post 11 on the surface 102 of the dielectric layer 10d is included in a projection area of the barrier layer 10b on the surface 102 of the dielectric layer 10d.

In some embodiments, the conductive post 11 includes a conductive layer 11a, a barrier layer 11b and a soldering layer 11c. The conductive layer 11a is disposed on the surface 10b2 of the barrier layer 10b. The barrier layer 11b is disposed adjacent to or in contact with the conductive layer 11a. The soldering layer 11c is disposed adjacent to or in contact with the barrier layer 11b. In some embodiments, the conductive layer 11a, the barrier layer 11b and the soldering layer 11c have a common width D12. In some embodiments, the conductive layer 11a is formed of or includes Au, Ag, Cu, Pt, Pd, other metal(s) or alloy(s), or a combination of two or more thereof. In some embodiments, the barrier layer 11b is formed of or includes Ni, Ti, W, other metal(s) or alloy(s), or a combination of two or more thereof. In some embodiments, the soldering layer 11c is formed of or includes Au, Ag, Cu, Pt, Pd, other metal(s) or alloy(s), or a combination of two or more thereof. In some embodiments, a thickness of the conductive layer 11a is from about 3 μm to about 20 μm, a thickness of the barrier layer 11b is from about 1 μm to about 5 μm and a thickness of the soldering layer 11c is from about 1 μm to about 3 μm.

The electrical contact 16 (e.g. a solder ball or a solder bump) is disposed on a surface 112 of the conductive post 11 (e.g., on the surface 112 of the soldering layer 11c) to provide for electrical connections between the semiconductor device package 1 and other circuits or circuit boards. In some embodiments, the electrical contact 16 is a controlled collapse chip connection (C4) bump, a ball grid array (BGA) or a land grid array (LGA). In some embodiments, a diameter of the electrical contact 16 is from about 25 μm to about 100 In some embodiments, the conductive post 11 can be omitted and the electrical contact 16 is directly disposed on the surface 10b2 of the barrier layer 10b. In some embodiments, the conductive post 11 and the electrical contact 16 can be used for a fan-in structure, a fan-out structure or a combination of the fan-in and fan-out structure.

As mentioned above, when forming soldering contacts on a substrate, a bleeding may occur (e.g. during a reflow process), which would cause an undesired short (e.g., bridge) between two conductive pads. In some existing approaches, a solder resist should be used to avoid the bridge issue. However, the use of the solder resist would increase the manufacturing cost and the thickness of the semiconductor device package. In addition, due to the CTE mismatch between the solder resist and the substrate, a warpage and/or delamination issue would occur. In accordance with the embodiments, as shown in FIGS. 1A and 1B, by disposing the barrier layer 10b on the conductive layer 10r to cover the conductive layer 10r, the bleeding issue can be eliminated without using a solder resist, which would reduce the manufacturing cost and the thickness of the semiconductor device package 1. In addition, the warpage and the delamination issue can be also eliminated.

Referring back to FIG. 1A, the substrate 10 may include a recess or cavity to expose the conductive layer 10r. A conductive layer 12r is disposed on surface 101 of the substrate 10. In some embodiments, the conductive layer 12r may extends into the recess or cavity of the substrate 10 and electrically connects to the conductive layer 10r to provide electrical connections between the surface 101 of the substrate 10 and the surface 102 of the substrate 10. In some embodiments, a line space (L/S) of the conductive layer 12r is equal to or less than about 2 μm/2 μm.

The passivation layer 12 is disposed on the surface 101 of the substrate 10 to cover the conductive layer 12r. In some embodiments, the passivation layer 12 is also disposed within the recess or cavity of the substrate 10. In some embodiments, the passivation layer 12 includes a recess or cavity and an under ball metallization (UBM) 13b may be disposed within the recess or cavity to be electrically connected to the conductive layer 12r. In some embodiments, the passivation layer 10 includes silicon oxide, silicon nitride, gallium oxide, aluminum oxide, scandium oxide, zirconium oxide, lanthanum oxide, hafnium oxide, another oxide, another nitride, or a combination of two or more thereof. In some embodiments, the passivation layer 12 can be replaced by solder mask liquid (e.g., in an ink form) or film depending on specifications of various embodiments. In some embodiments, a thickness of the passivation layer 12 is from about 5 µm to about 20 µm.

The electronic component 13 is disposed on the passivation layer 12 and electrically connected to the conductive layer 12r on the substrate 10 through the UBM 13b and a conductive contact 13a (e.g., a micro-bump). The electronic component 13 may include a chip or a die including a semiconductor substrate, one or more integrated circuit devices, and/or one or more overlying interconnection structures disposed therein. The integrated circuit devices may include active devices such as transistors and/or passive devices such resistors, capacitors, inductors, or a combination of two or more thereof. In some embodiments, the number of the electronic component 13 can be changed depending on different design specifications. For example, the semiconductor device package 1 may include N electronic components on the passivation layer 12 and electrically connected to the conductive layer 12r, where N is an integer.

In some embodiments, the electrical contact 13a of the electronic component 13 may be covered or encapsulated by an underfill 13u. In some embodiments, the underfill 13u includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 13u may be a capillary underfill (CUF), a molded underfill (MUF) or a dispensing gel, depending on specifications of different embodiments. In some embodiments, the underfill 13u can be omitted.

The package body 14 is disposed on the passivation layer 12 and covers the electronic component 13 and the underfill 13u. As shown in FIG. 1A, a top surface 141 of the package body 14 is substantially coplanar with a backside surface 131 of the electronic component 13. For example, the backside surface 131 of the electronic component 13 is exposed from the package body 14. Alternatively, the package body 14 may cover the backside surface 131 of the electronic component 13. In some embodiments, the package body 14 includes, for example, one or more organic materials (e.g., a molding compound, bismaleimide triazine (BT), a PI, a polybenzoxazole (PBO), a solder resist, an ABF, a polypropylene (PP), an epoxy-based material, or a combination of two or more thereof), inorganic materials (e.g., silicon, a glass, a ceramic, a quartz, or a combination of two or more thereof), a liquid-film material or a dry-film material, or a combination of two or more thereof. In some embodiments, the package body 14 may be a dispensing gel.

Figure 2:
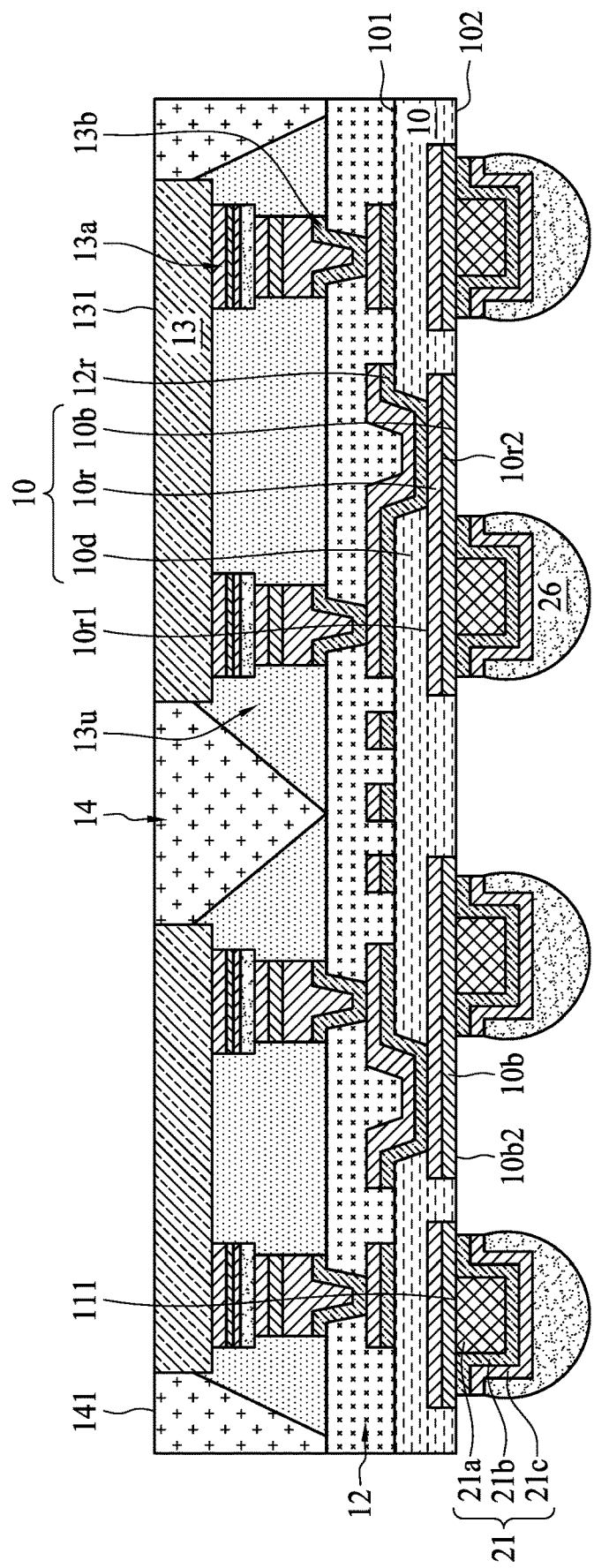
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1A except that a conductive contact 26 of the semiconductor device package 2 covers sidewall of a conductive post 21. The conductive post 21 is disposed on the surface 10b2 of the barrier layer 10b. In some embodiments, the conductive post 21 is in contact with the barrier layer 10b. The conductive post 21 is similar to the conductive post 11 of the semiconductor device package 1 except that a barrier layer 21b of the conductive post 21 covers a conductive layer 21a and a soldering layer 21c covers the barrier layer 21b.

Figure 3:
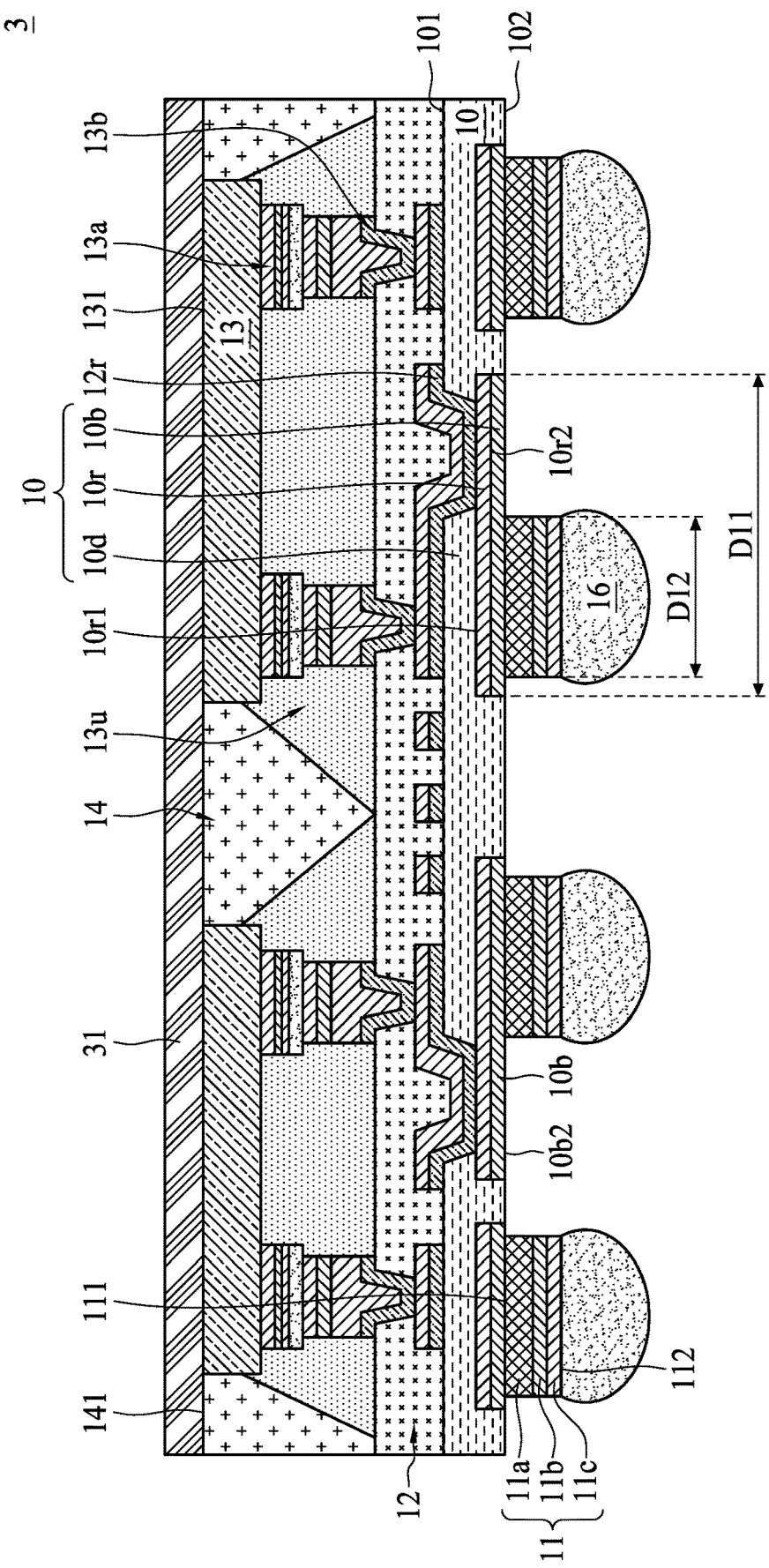
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1A except that the semiconductor device package 3 further includes a film 31 disposed on the top surface 141 of the package body 14 and the backside surface 131 of the electronic component 13. The film 31 can be used to eliminate or mitigate the warpage issue of the semiconductor device package 13 or to enhance the heat dissipation for the electronic component 13. In some embodiments, the film 31 is formed of a metal material, such as Cu, Ni, Ti, W, Pt other metal(s) or alloy(s), or a combination of two or more thereof. In some embodiments, the film 31 is formed of a non-metal material, such as PI, ABF, epoxy, molding compound or solder mask ink.

Figure 4:
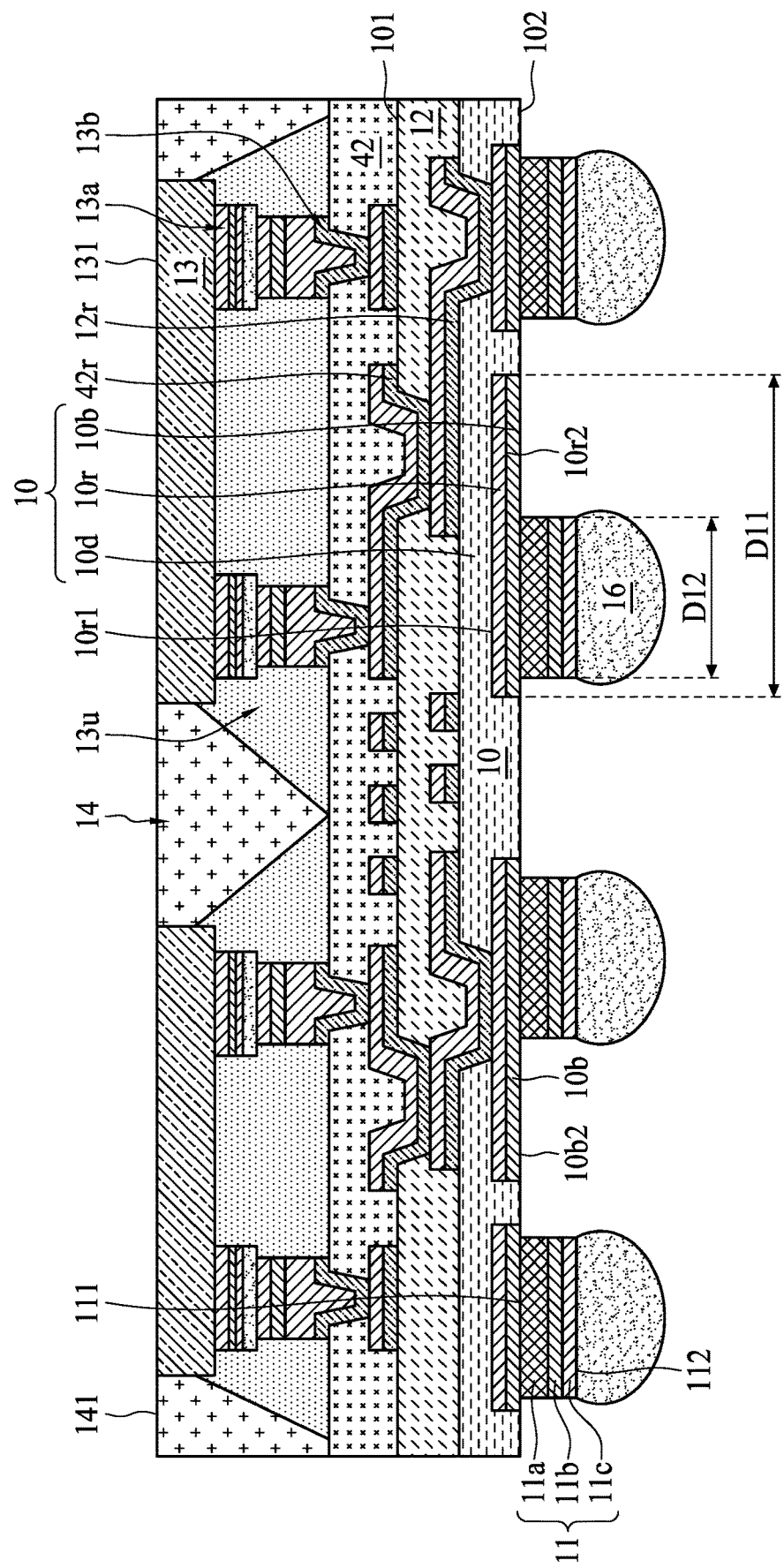
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 1 in FIG. 1A except that the semiconductor device package 4 further includes a passivation layer 42 disposed on the passivation layer 12. The passivation layer 12 has a recess or cavity to expose the conductive layer 12r. The passivation layer 42 has a conductive layer 42r disposed thereon and within the recess or cavity to be electrically connected to the conductive layer 12r. The passivation layer 42 has a recess or cavity to expose the conductive layer 42r. The electronic component 13 is connected to the conductive layer 42 through the electrical contact 13a and the UBM 13b. In some embodiments, the passivation layer 42 and the passivation layer 12 are formed of the same material. Alternatively, the passivation layer 42 and the passivation layer 12 are formed of the different materials.

Figure 5:
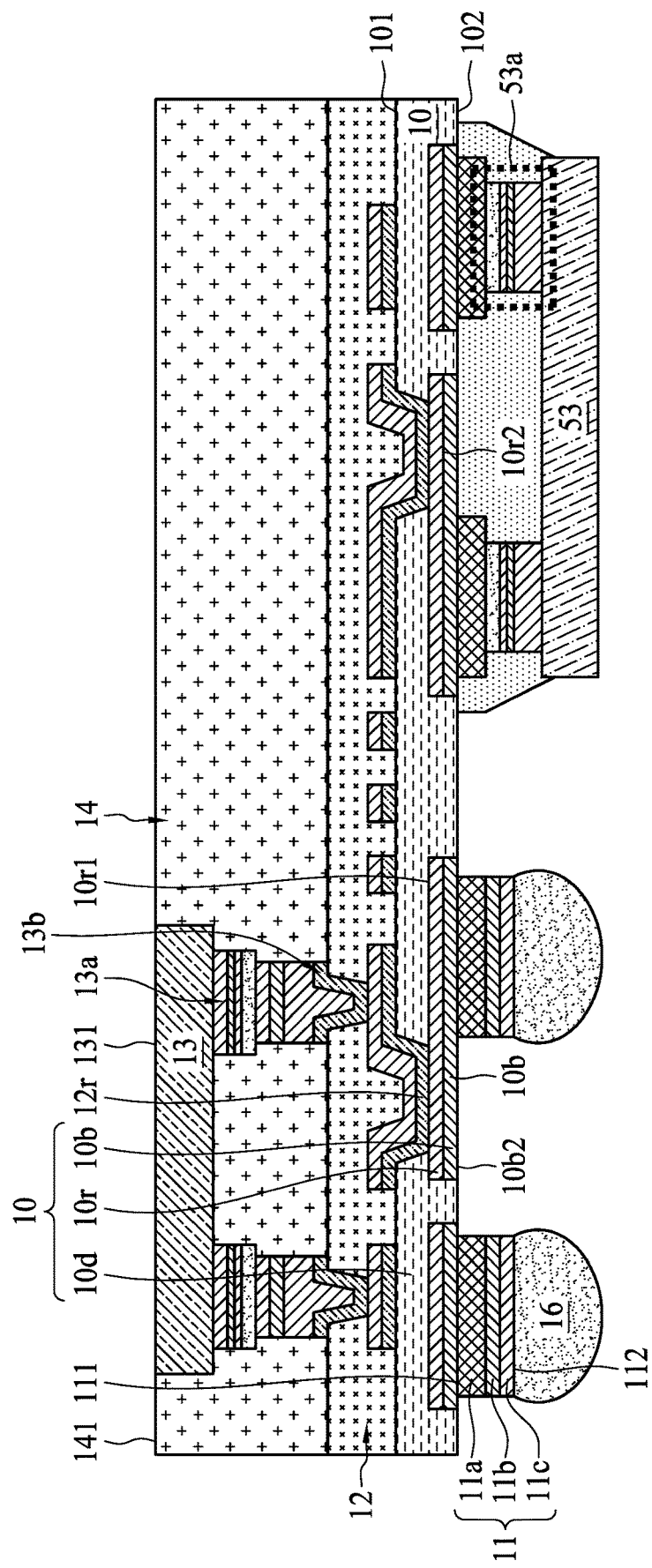
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 is similar to the semiconductor device package 1 in FIG. 1A, and the differences therebetween include that the semiconductor device package 5 does not include the underfill and that the semiconductor device package 5 further includes an electronic component 53 disposed on the surface 102 of the substrate 10. The electronic component 53 is electrically connected to the barrier layer 10b through a conductive contact 53a (e.g., a micro-bump). The electronic component 53 may include a chip or a die including a semiconductor substrate, one or more integrated circuit devices, and/or one or more overlying interconnection structures disposed therein. The integrated circuit devices may include active devices such as transistors and/or passive devices such resistors, capacitors, inductors, or a combination of two or more thereof.

Figure 6:
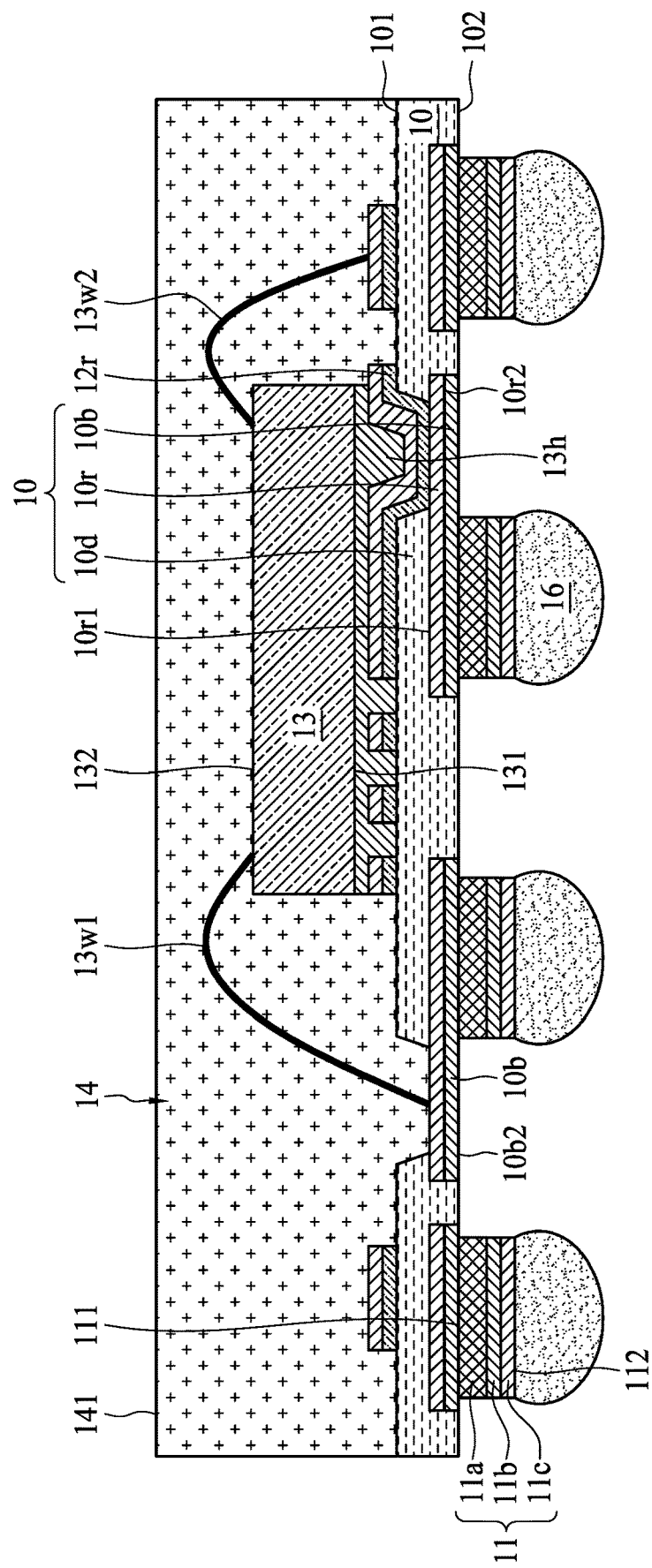
FIG. 6 illustrates a cross-sectional view of a semiconductor device package in accordance with some embodiments of the present disclosure.

FIG. 6 illustrates a cross-sectional view of a semiconductor device package 6 in accordance with some embodiments of the present disclosure. The semiconductor device package 6 is similar to the semiconductor device package 1 in FIG. 1A except that in FIG. 1A, the electronic component 13 is electrically connected to the substrate 10 through the conductive contact 13a and the UBM 13b while in FIG. 6, the electronic component 13 is electrically connected to the substrate 10 through bonding wires 13w1 and 13w2. The backside surface 131 is attached to the substrate 10 through an adhesive layer 13h (e.g., a glue). In some embodiments, the bonding wire 13w2 electrically connects an active side 132 of the electronic component 13 to the conductive pad on the surface 101 of the substrate 10. In some embodiments, the bonding wire 13w1 electrically connects the active side 132 of the electronic component 13 to the conductive layer 10r adjacent to the surface 102 of the substrate 10.

Figure 7:
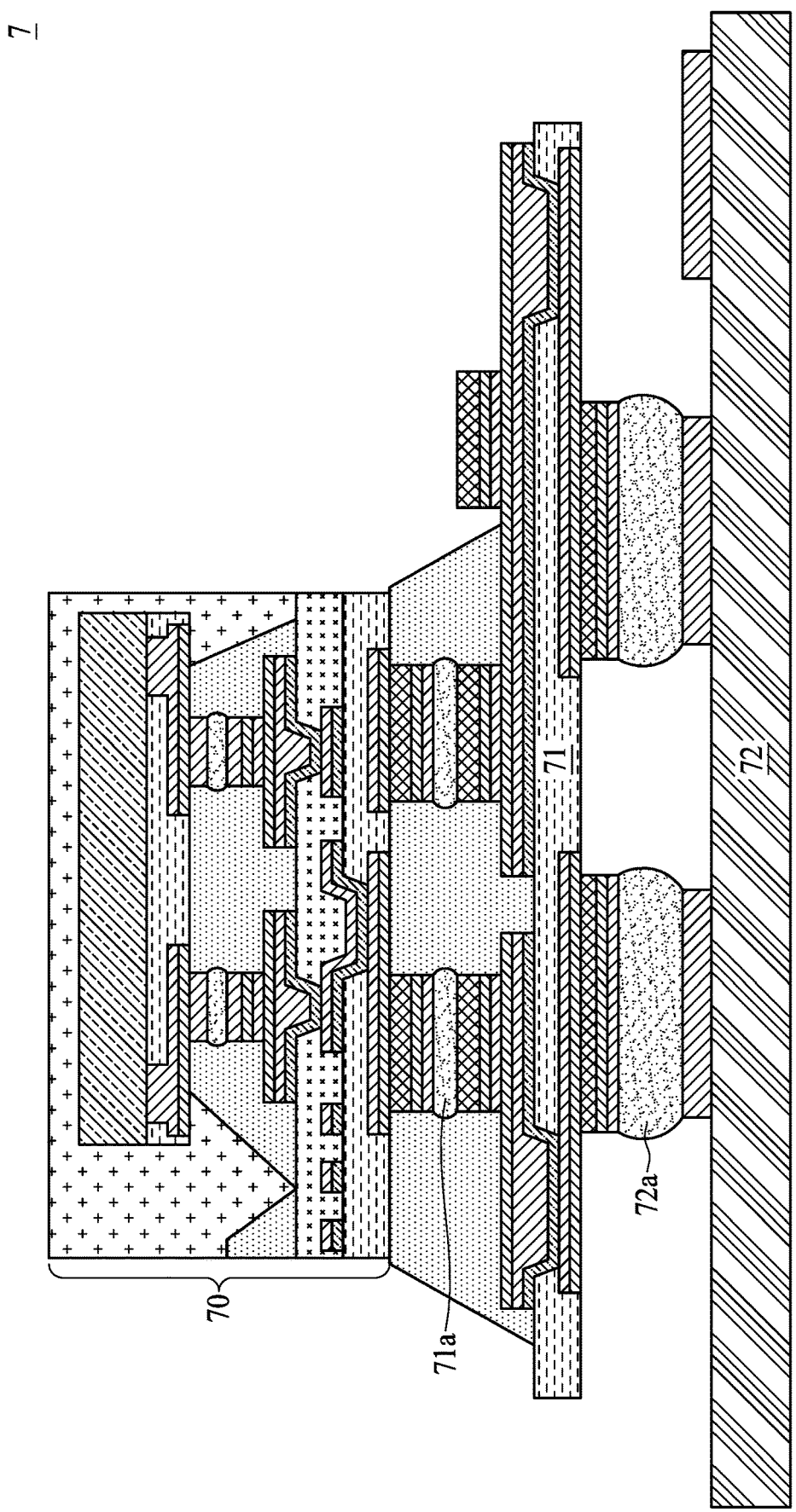
FIG. 7 illustrates a cross-sectional view of an electrical device in accordance with some embodiments of the present disclosure.

FIG. 7 illustrates a cross-sectional view of an electrical device 7 in accordance with some embodiments of the present disclosure. The electrical device 7 includes a semiconductor device package 70, a substrate 71 and a printed circuit board (PCB) 72. The semiconductor device package 70 can be any of the semiconductor device packages 1, 2, 3, 4, 5 and 6 as shown in FIGS. 1A, 2, 3, 4, 5 and 6 or any other semiconductor device packages. The semiconductor device package 70 is electrically connected to the substrate 71 through an electrical contact 71a (e.g., C4 bump) and the substrate 71 is electrically connected to the PCB 72 through an electrical contact 72a (e.g., solder ball). In some embodiments, the substrate 71 may include a similar structure to the substrate 10 as shown in FIG. 1A.

FIG. 8A, FIG. 8B, FIG. 8C, FIGS. 8D, 8E, 8F and 8F' are cross-sectional views of a semiconductor structure fabricated at various stages, in accordance with some embodiments of the present disclosure. At least some figures have been simplified for a better understanding of the aspects of the present disclosure.

Figure 8A:
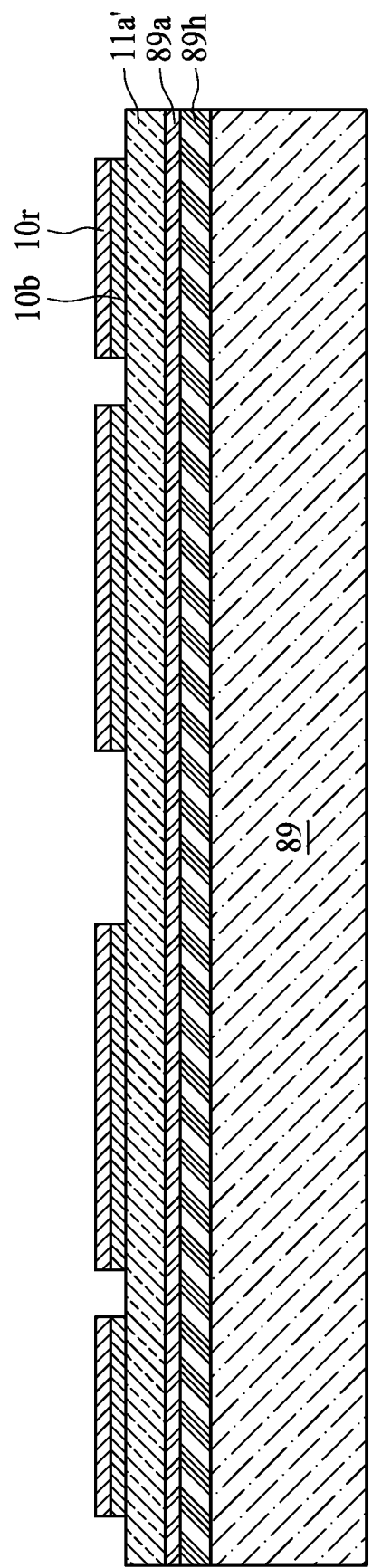
FIG. 8A, FIG. 8B, FIG. 8C, FIG. 8D, FIG. 8E, FIG. 8F and FIG. 8F' illustrate a method of manufacturing a semiconductor device package in accordance with some embodiments of the present disclosure.

Referring to FIG. 8A, a carrier 89 is provided and a Ti layer 89a is attached to the carrier 89 through an adhesive (or release film) 89h. The Ti layer 89a is used to facilitate the following process. In some embodiments, the Ti layer 89a can be omitted. A conductive layer 11a' (e.g., seed layer) is formed on the Ti layer 89 by physical vapor deposition (PVD) or other suitable processes. In some embodiments, the conductive layer includes a Ti and Cu alloy (Ti/Cu) or other suitable materials.

A barrier layer 10b and a conductive layer 10r are then formed on the conductive layer 11a'. In some embodiments, the barrier layer 10b and the conductive layer 10r can be formed by lithographic processes. For example, a photoresist is formed on the conductive layer 11a' by, for example, coating; an exposure process and a developing process are then carried out on the photoresist to define one or more openings to expose the conductive layer 11a; the barrier layer 10b and the conductive layer 10r are formed within the openings and on the exposed portion of the conductive layer 11a' by, for example, plating; and the photoresist is removed from the conductive layer 11a'.

Figure 8B:
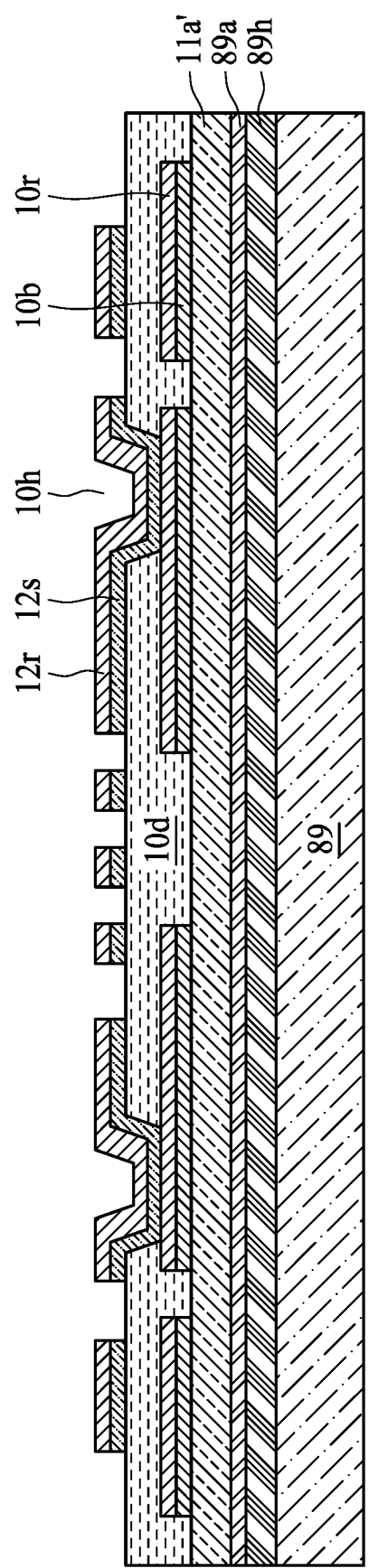

Referring to FIG. 8B, a dielectric layer 10d (or passivation layer) is formed on the conductive layer 11a' to cover the conductive layer 10r and the barrier layer 10b. The dielectric layer 10d may include one or more openings 10h to expose the conductive layer 10r. A seed layer 12s and a conductive layer 12r are formed on the dielectric layer 10d and within the openings 10h to be electrically connected to the conductive layer 10r. In some embodiments, the dielectric layer 10d is formed by coating and the openings 10h of the dielectric layer 10d can be formed by lithographic processes. In some embodiments, the seed layer 12s and the conductive layer 12r are formed by lithographic processes. For example, a seed layer is formed to fully cover an top surface of the dielectric layer 10d and within the openings 10h of the dielectric layer 10d; a photoresist is formed on the seed layer by for example, coating; a developing process is carried out on the photoresist to form one or more openings to expose a portion of the seed layer; a conductive layer is formed on the exposed portion of the seed layer by, for example, plating; and then the photoresist and a portion of the seed layer covered by the photoresist are removed to form the conductive layer 12r.

Figure 8C:
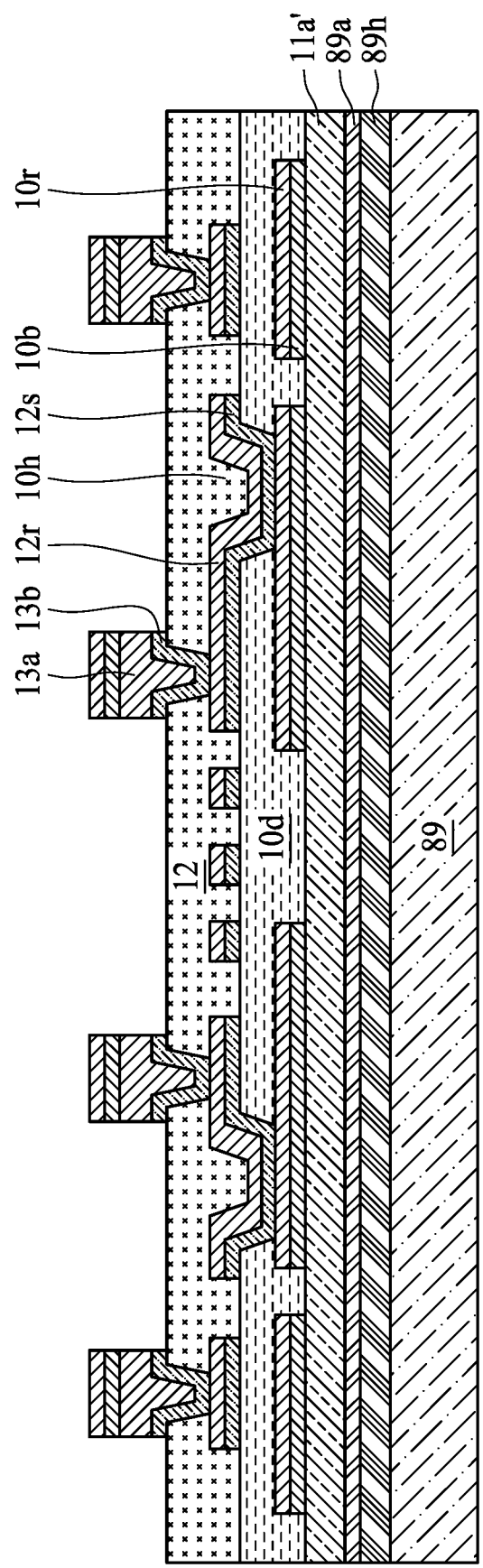

Referring to FIG. 8C, a passivation layer 12 is formed on the dielectric layer 10d to cover the conductive layer 12r. In some embodiments, the passivation layer 12 is formed by coating or other suitable processes. One or more openings are formed by, for example, a lithographic technique to expose a portion of the conductive layer 12r. A conductive layer 13b (e.g., UBM) is formed within the openings and an electrical contact 13a is then formed on the conductive layer 13b. In some embodiments, the conductive layer 13b and the electrical contact 13a may be formed by lithographic processes similar to the processes for forming the conductive layer 12r or the conductive layer 10r.

Figure 8D:
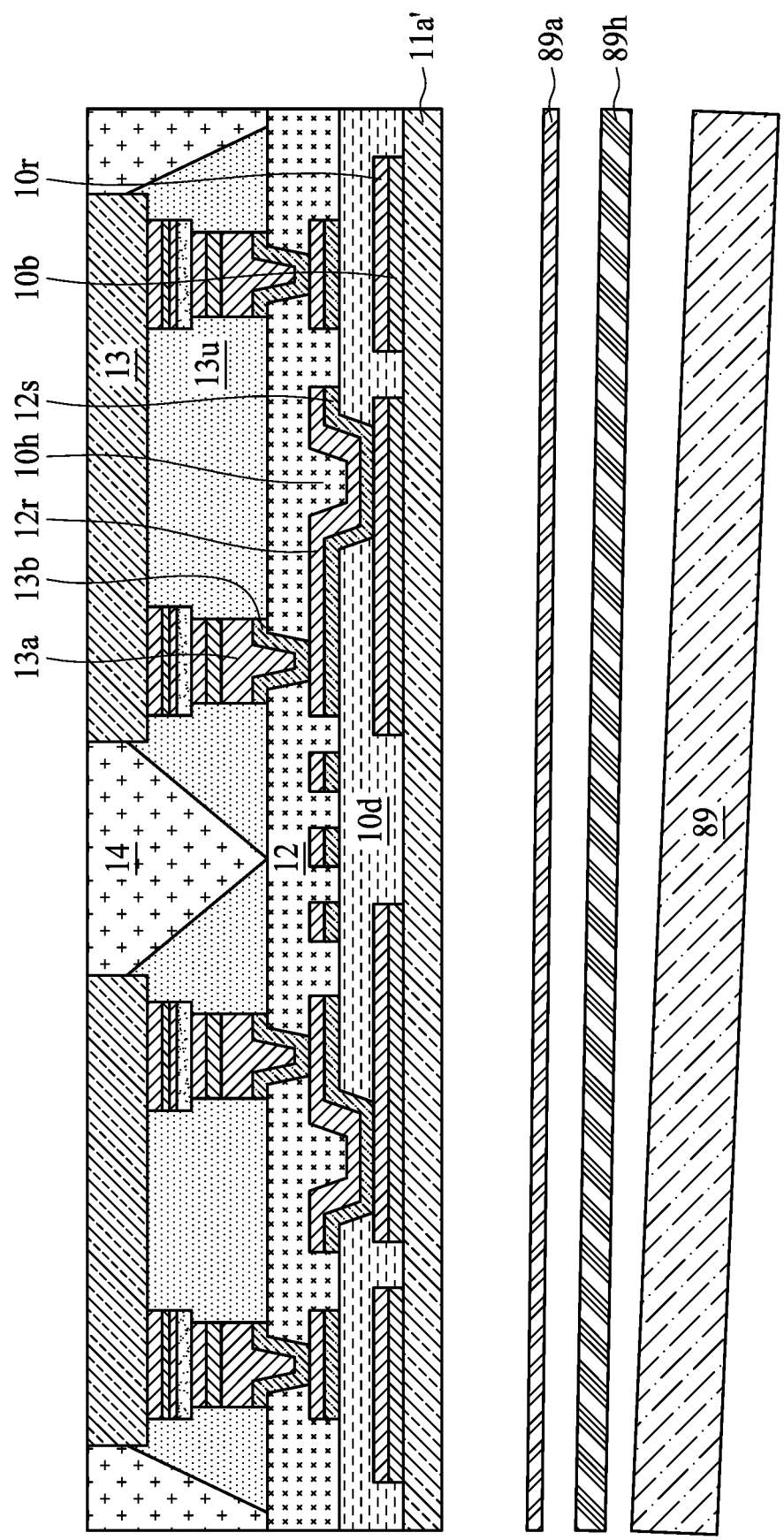

Referring to FIG. 8D, an electronic component 13 is electrically connected to the electrical contact 13a through a bonding process. An underfill 13u is formed to cover the electrical contact 13a of the electronic component 13. A package body 14 is formed to cover the electronic component 13 and the underfill 13u by any suitable molding processes. The carrier along with the adhesive 89h and the Ti layer 89a are removed from the conductive layer 11a' to expose the conductive layer 11a'.

Figure 8E:
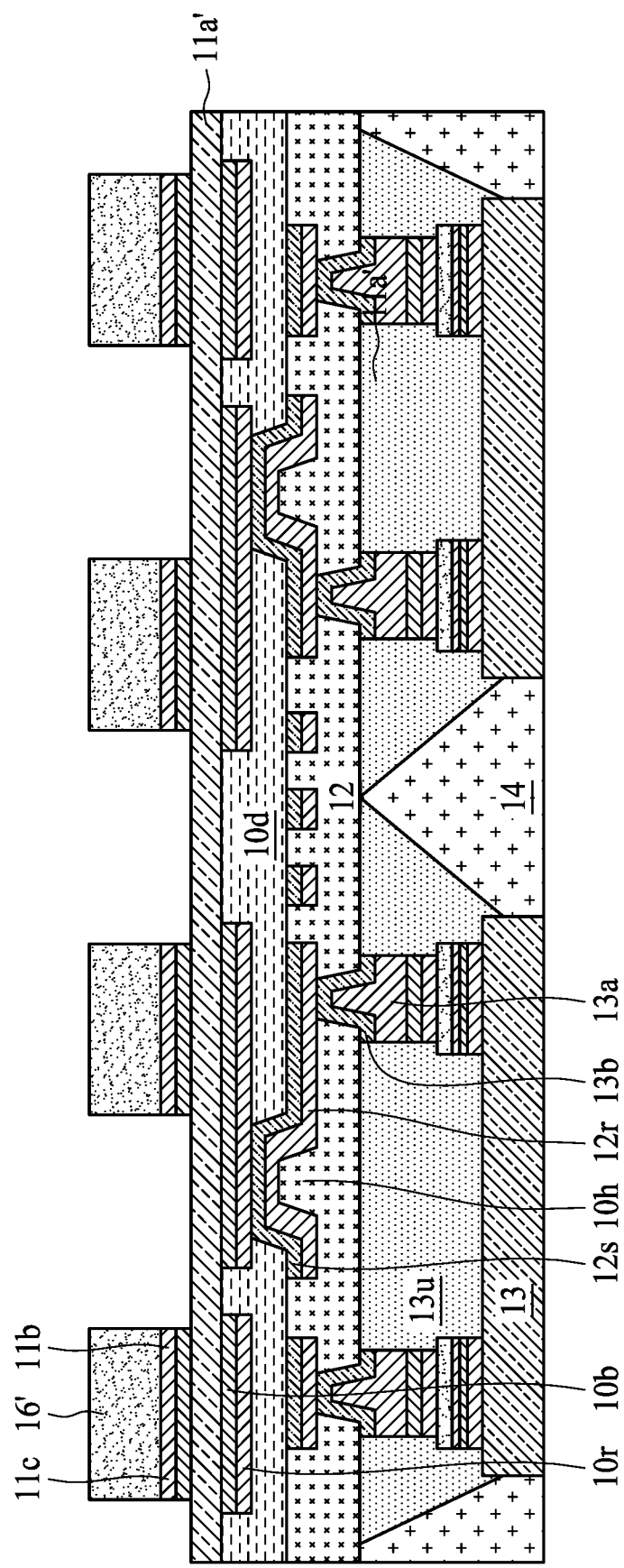

Referring to FIG. 8E, a barrier layer 11b and a soldering layer 11c are formed on the conductive layer 11a' by, for example, lithographic processes similar to the processes for forming the conductive layer 10r or the conductive layer 12r. A solder 16' is formed on the soldering layer 11c.

Figure 8F:
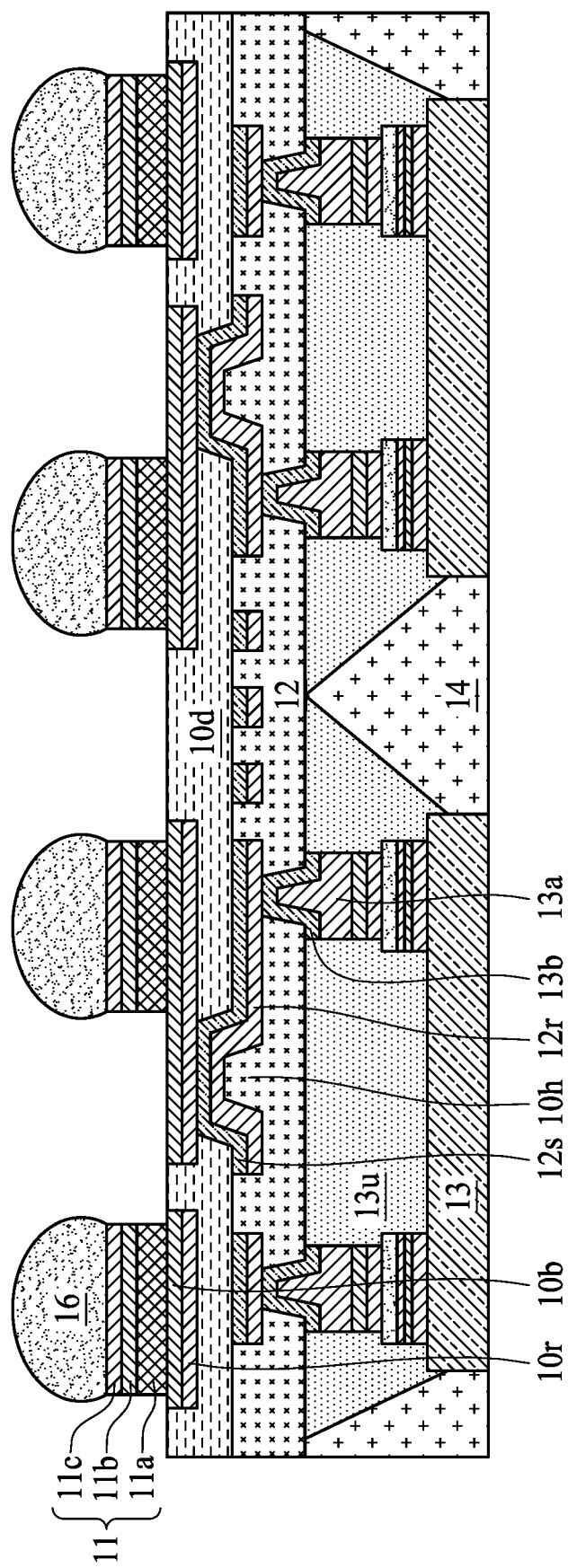
Figure 8F:
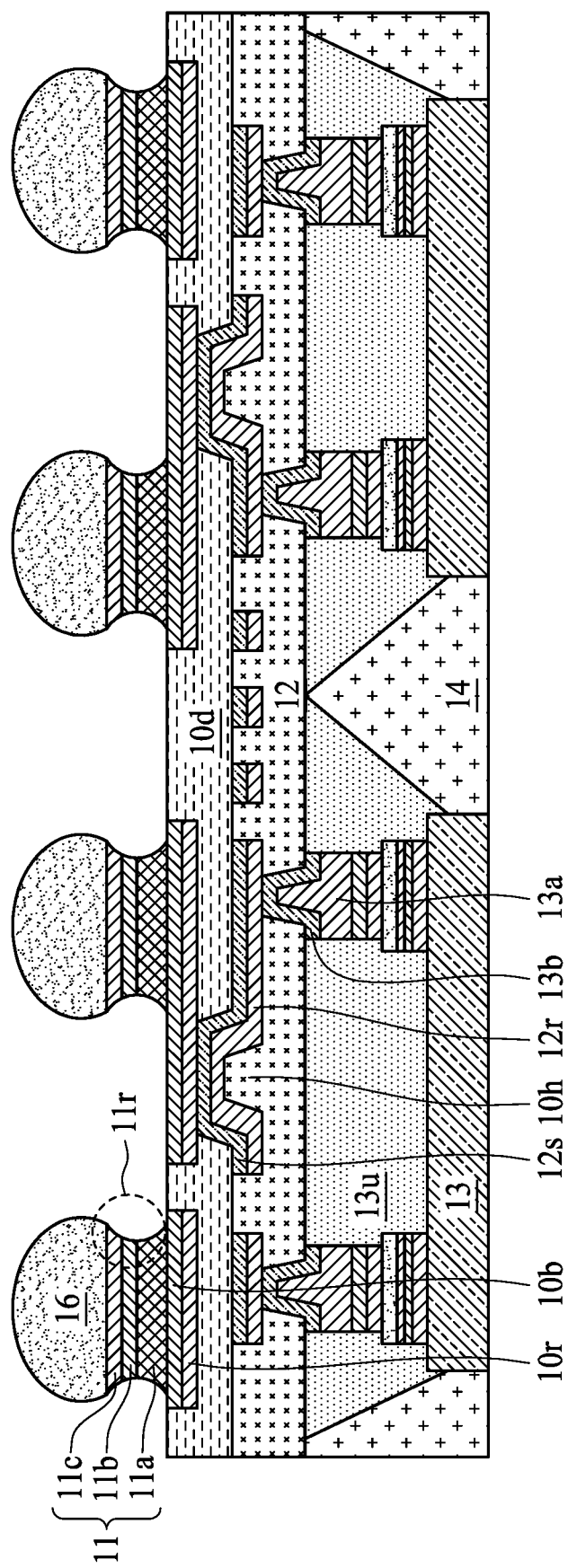

Referring to FIG. 8F, a portion of the conductive layer 11a' on which the barrier layer 11b or the soldering layer 11c are not disposed is removed to form a conductive post 11 (including the conductive layer 11a, the barrier layer 11b and the soldering layer 11c). In some embodiments, the portion of the conductive layer 11a' can be removed by, for example, etching or other suitable processes. In some embodiments, during the etching process, a portion of the sidewall of the conductive post 11 may be also removed to form a recess 11r as shown in FIG. 8F'. Then, a reflow process is carried out to form the electrical contact 16 (e.g., solder ball).

Figure 9B:
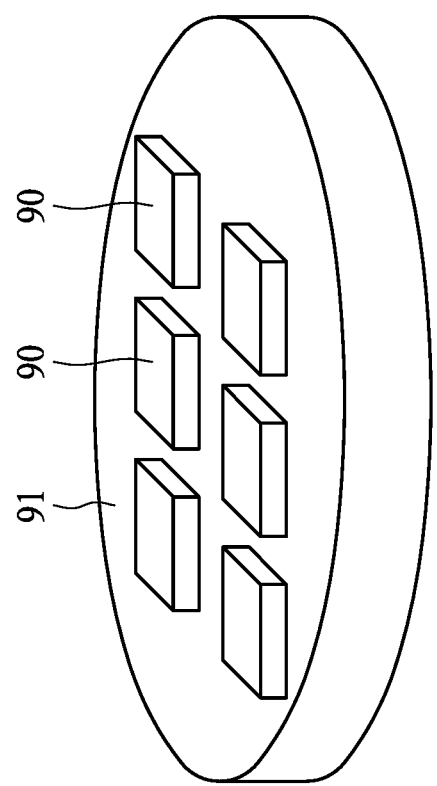
FIG. 9B illustrates semiconductor device packages in accordance with some embodiments of the present disclosure.
Figure 9A:
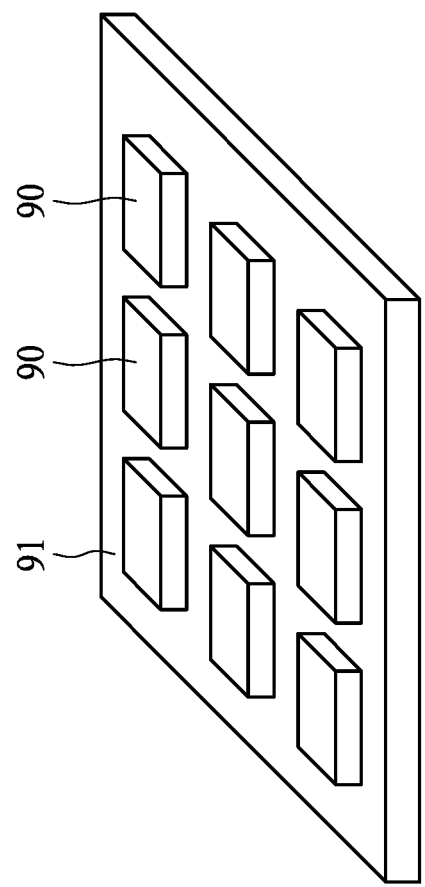
FIG. 9A illustrates semiconductor device packages in accordance with some embodiments of the present disclosure.

FIG. 9A and FIG. 9B illustrate different types of semiconductor device packages in accordance with some embodiments of the present disclosure.

As shown in FIG. 9A, a plurality of chips or dies 90 are placed on a square-shaped carrier 91. In some embodiments, the carrier 91 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

As shown in FIG. 9B, a plurality of chips or dies 90 are placed on a circle-shaped carrier 92. In some embodiments, the carrier 92 may include organic materials (e.g., a molding compound, BT, a PI, a PBO, a solder resist, an ABF, a PP, epoxy-based material, or a combination of two or more thereof) or inorganic materials (e.g., silicon, a glass, a ceramic, a quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate, including:
      a dielectric layer having a first surface and a second surface opposite to the first surface;
      a first conductive layer disposed adjacent to the first surface of the dielectric layer; and
      a first barrier layer disposed on the first conductive layer, wherein the first barrier layer is substantially planar and has a surface substantially coplanar with the first surface of the dielectric layer; and
   a conductive post disposed on the first barrier layer,
   wherein a width of the conductive post is less than a width of the first barrier layer,
   wherein the first barrier layer has a first portion in direct contact with the conductive post and an etch stop layer exposed from the first surface of the dielectric layer and spaced apart from the conductive post.

2. The semiconductor substrate of claim 1, wherein
   the conductive post has a first surface in contact with the first barrier layer and a second surface opposite to the first surface; and
   the first surface of the conductive post is substantially coplanar with the first surface of the dielectric layer.

3. The semiconductor substrate of claim 2, further comprising a conductive contact disposed on the second surface of the conductive post.

4. The semiconductor substrate of claim 1, wherein a projection area of the conductive post on the first surface of the dielectric layer is included in a projection area of the first barrier layer on the first surface of the dielectric layer.

5. The semiconductor substrate of claim 1, wherein the first barrier layer has a first surface in contact with the conductive post, and the first surface of the first barrier layer is exposed from the dielectric layer.

6. The semiconductor substrate of claim 5, wherein the first conductive layer is disposed within the dielectric layer and the first surface of the first barrier layer is substantially coplanar with the first surface of the dielectric layer.

7. The semiconductor substrate of claim 1, wherein the conductive post includes:
   a second conductive layer in contact with the first barrier layer;
   a second barrier layer disposed on the second conductive layer; and
   a third conductive layer disposed on the second barrier layer.

8. The semiconductor substrate of claim 7, wherein
   the second conductive layer and the third conductive layer include: gold (Au), silver (Ag), copper (Cu), platinum (Pt), palladium (Pd) or its alloy; or
   the second barrier layer includes: nickel (Ni), titanium (Ti), tungsten (W) or its alloy.

9. The semiconductor substrate of claim 7, wherein a width of the second conductive layer, a width of the second barrier layer and a width of the third conductive layer are substantially the same.

10. The semiconductor substrate of claim 7, wherein
    a thickness of the second conductive layer is in a range from about 3 micrometer (μm) to about 20 μm;
    a thickness of the second barrier layer is in a range from about 1 μm to about 5 μm; and
    a thickness of the third conductive layer is in a range from about 1 μm to about 3 μm.

11. The semiconductor substrate of claim 1, wherein the first conductive layer is disposed on the first surface of the dielectric layer.

12. The semiconductor substrate of claim 1, wherein the first barrier layer includes: Ni, Ti, W or its alloy.

13. The semiconductor substrate of claim 1, wherein a thickness of the first barrier layer is in a range from about 1 μm to about 5 μm.

14. A semiconductor device package, comprising:
a substrate having a first surface and a second surface opposite to the first surface,
wherein the substrate includes a first conductive layer disposed adjacent to the first surface of the substrate and a first barrier layer disposed on the first conductive layer, wherein the first barrier layer is substantially planar and has a surface substantially coplanar with the first surface of the substrate;
a conductive post disposed on the first barrier layer,
wherein a width of the conductive post is less than a width of the first barrier layer,
wherein the first barrier layer has a first portion in direct contact with the conductive post and an etch stop layer exposed from the first surface of the substrate and spaced apart from the conductive post; and
a first electronic component disposed on the second surface of the substrate and electrically connected to the first conductive layer.

15. The semiconductor device package of claim 14, further comprising an underfill between the first electronic component and the second surface of the substrate.

16. The semiconductor device package of claim 15, further comprising a package body disposed on the second surface of the substrate and covering the first electronic component and the underfill.

17. The semiconductor device package of claim 14, wherein a projection area of the conductive post on the first surface of the substrate is included in a projection area of the first barrier layer on the first surface of the substrate.

18. The semiconductor device package of claim 14, wherein the first barrier layer has a first surface in contact with the conductive post, and the first surface of the first barrier layer is substantially coplanar with the first surface of the substrate.

19. The semiconductor device package of claim 14, wherein the conductive post includes:
a second conductive layer in contact with the first barrier layer;
a second barrier layer disposed on the second conductive layer; and
a third conductive layer disposed on the second barrier layer.

20. The semiconductor device package of claim 19, wherein a width of the second conductive layer, a width of the second barrier layer and a width of the third conductive layer are substantially the same.

21. The semiconductor device package of claim 14, wherein the first barrier layer includes: Ni, Ti, W or its alloy.

22. A method for manufacturing a semiconductor device package, the method comprising:
(a) forming a barrier layer substantially planar and having a first surface and a second surface opposite to the first surface;
(b) forming a first conductive layer on the first surface of the barrier layer;
(c) forming a dielectric layer to cover the barrier layer and the first conductive layer and to expose the second surface of the barrier layer from the dielectric layer; and
(d) forming a conductive post on the second surface of the barrier layer and in direct contact with a first portion of the barrier layer, wherein operation (d) further comprises:
(e) forming a second conductive layer on a surface of the dielectric layer that is substantially coplanar with the second surface of the barrier layer; and
(f) etching a portion of the second conductive layer so that a width of the second conductive layer is less than a width of the barrier layer, wherein the etching stops at an etch stop layer of the barrier layer exposed from the dielectric layer.

23. The method of claim 22, wherein the barrier layer and the first conductive layer are formed by lithography technique.

24. The semiconductor substrate of claim 1, wherein a solder bump is disposed on the conductive post.

25. The semiconductor substrate of claim 1, wherein the first barrier layer includes a first edge and a second edge and the conductive post includes a first edge and a second edge,
wherein the first edge of the first barrier layer is shifted from the first edge of the conductive post with a first space a first direction parallel with the first surface of the dielectric layer; and
wherein the second edge of the first barrier layer is shifted from the second edge of the conductive post with a second space in a reverse direction of the first direction.

26. The semiconductor device package of claim 14, further comprising a first circuit layer electrically connected to the first conductive layer, wherein the first circuit layer includes a first seed layer in direct contact with the first conductive layer.

27. The semiconductor device package of claim 26, further comprising a second circuit layer electrically connected to the first circuit layer, wherein the second circuit layer includes a second seed layer in direct contact with the first circuit layer.

28. The semiconductor device package of claim 27, further comprising an under ball metallization (UBM) electrically connected to in direct contact with the second circuit layer, wherein the first electronic component is electrically connected to the UBM.

29. The semiconductor device package of claim 14, further comprising a second electronic component disposed on the second surface of the substrate, wherein the first electronic component and the second electronic component are side by side.

30. The semiconductor device package of claim 14, further comprising a second electronic component disposed on the first surface of the substrate, wherein the second electronic component is electrically connected to the barrier layer through the conductive contact.

31. The semiconductor device package of claim 14, wherein the electronic component is electrically connected to the first conductive layer through a bonding wire.

* * * * *